United States Patent [19]

Ueda et al.

[11] Patent Number: 4,716,295

[45] Date of Patent: Dec. 29, 1987

[54] ION BEAM GENERATOR

[75] Inventors: Yoshihiro Ueda; Kouichi Ono; Tatsuo Oomori; Shigeto Fujita, all of Amagasaki, Japan

[73] Assignee: Mitsubishi Denki Kabushiki Kaisha, Tokyo, Japan

[21] Appl. No.: 782,725

[22] Filed: Oct. 1, 1985

[51] Int. Cl.[4] .......... H01J 37/00

[52] U.S. Cl. .......... 250/423 P; 250/492.2

[58] Field of Search .......... 250/423 P, 492.21, 398; 423/DIG. 7

[56] References Cited

U.S. PATENT DOCUMENTS

| | | | |
|---|---|---|---|
| 3,521,054 | 7/1980 | Poschenriede et al. | 250/423 P |
| 3,914,655 | 10/1975 | Dreyfes et al. | 250/423 P |
| 3,987,302 | 10/1976 | Hurst et al. | 250/423 P |
| 4,107,537 | 8/1978 | Forsen et al. | 250/423 P |
| 4,149,077 | 4/1979 | Yamashita et al. | 250/423 P |
| 4,266,854 | 5/1981 | Avicola | 250/423 P |
| 4,358,686 | 11/1982 | Kinoshita | 250/492.21 |
| 4,419,582 | 12/1983 | Janes et al. | 250/423 P |

OTHER PUBLICATIONS

"Stark Ionization of High-Lying States of Sodium", Ducas et al., *Phy. Review Letters,* 8-75, pp. 366-369-Aug. 11, 1975.

*Primary Examiner*—Bruce C. Anderson
*Attorney, Agent, or Firm*—Birch, Stewart, Kolasch & Birch

[57] ABSTRACT

An ion beam generator having an ion generating section for generating ions where the material to be ionized is introduced and a light source for introducing a light into the ion generating sections. This light has a wavelength such that it excites the material to be ionized to the intermediate state from the ground state of the material by a resonance excitation. The specific material to be taken out as an ion beam is selectively ionized through the intermediate state.

36 Claims, 15 Drawing Figures

ION BEAM GENERATOR

FIELD OF THE INVENTION

The present invention relates to an ion beam generator used for material improvement or material synthesization such as in a semiconductor processing device.

BACKGROUND OF THE INVENTION

Conventionally, various kinds of methods are proposed and put into practice for generating ions in an ion beam generator. Contrary to that almost all of them are ones utilizing a discharge, ions sources utilizing laser lights have been recently developed. There are two ionizing methods utilizing laser lights. One of them uses plasma as an ion source which plasma are generated by irradiating lights such as laser light to solid material such as metal or by irradiating a bunching laser light to gas or liquid material. The other of them is one which ionizes the material by making a laser light of mono-wavelength resonate with the energy level of the material to be ionized with the use of a variable wavelength laser. The present invention relates to the latter type ion beam generator.

SUMMARY OF THE INVENTION

The object of the present invention is to provide an ion beam generator capable of enhancing the ionization efficiency per input light energy by several figures or more as compared with the conventional resonance excitation ionization method.

Another object of the present invention is to provide an ion beam generator superior in the selectivity in the selective ionization.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided an ion beam generator, which comprises: an ion generating section for generating ions where the material to be ionized is introduced; a light source for introducing a light into the ion generating section which light has a wavelength such that it excites the material to be ionized to the intermediate state from the ground state of the material by a resonance excitation; and the specific material to be taken out as an ion beam being selectively ionized through the intermediate state.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A first embodiment of the present invention will be described in detail with reference to FIGS. 1 to 8.

Figure 1:
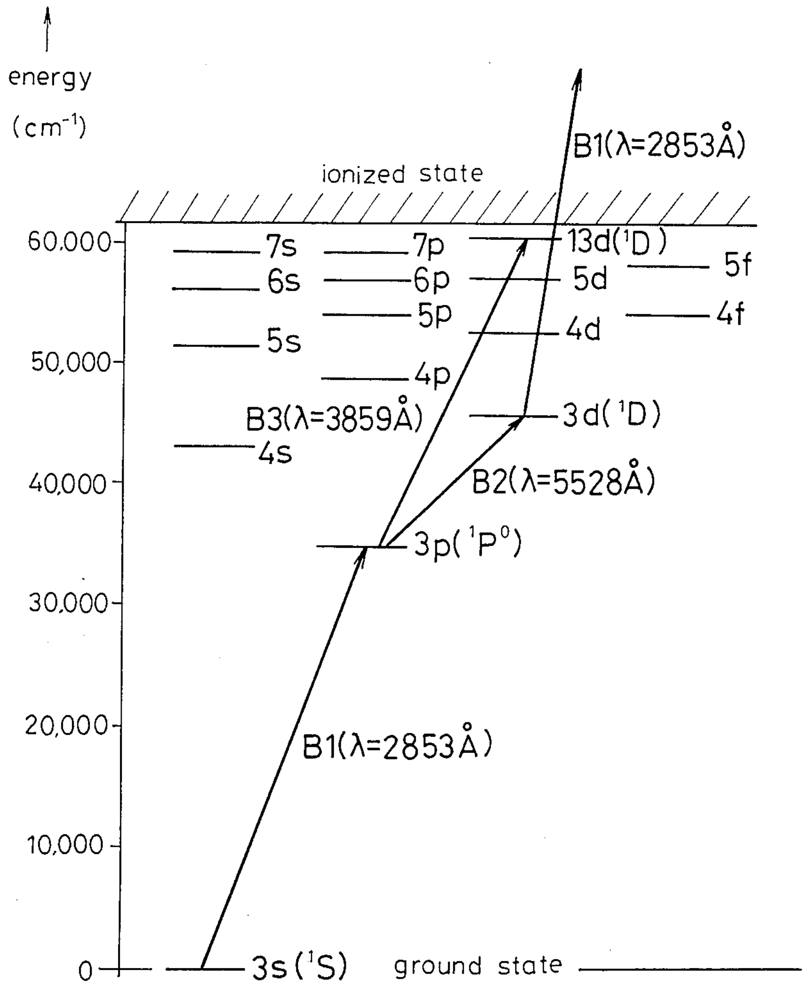
FIG. 1 is a diagram showing the energy levels for a singlet term magnesium neutral atom and the ionization method of the first embodiment of the present invention together with the conventional method.

FIG. 1 shows the energy levels for a singlet term magnesium neutral atom and the ionization method of the first embodiment together with the conventional method.

According to the conventional ionization method, two laser beams B1, B2 of wavelength 2853 Å and 5528 Å are irradiated to the magnesium vapor to be ionized. Then, the magnesium atom at the ground state $3s(^1S)$ is at first resonance excited to the first excited state $3p(^1P^0)$ by the laser beam B1 of 2853 Å, and thereafter it is resonance excited to the second excited state $3d(^1D)$ by the laser beam B2 of 5528 Å, and furthermore it is ionized by the laser beam B1 of 2853 Å.

On the other hand, according to the first embodiment of the present invention, the magnesium vapor is resonance excited by a laser beam or stepwisely resonance excited by a plurality of laser beams such as laser beams B1 of 2853 Å and B3 of 3859 Å to the Rydberg state $13d(^1D)$ from the ground state $3s(^1S)$, and the excited vapor at the Rydberg state is ionized by applying an electric field to the excited vapor so as to generate Stark effect or by applying a gas discharge to the excited vapor. In the case of applying an electric field in order to ionize the excited vapor which is resonance excited to the Rydberg state $13d(^1D)$, following value of the electric field is proper to be applied to the excited vapor together with the laser beam B3;

$$E(V/cm)=0.3125\times10^9\cdot n^{-4}$$

where n designates an effective main quantum number.

In a case of applying a gas discharge the excited vapor is ionized by such as electron collisions occurred caused by the gas discharge.

The ionization method of this first embodiment has an advantage that the collision cross-sectional area at the ionization is several or more figures higher than the direct ionization from the energy level 3d($^1$D) of the conventional method, thereby enabling lower energy output of the laser beam. Furthermore, it is possible to selectively ionize only the material to be ionized by selecting the wavelength of the laser beam not to coincide with the energy level of impurity atoms because the present invention utilizes perfectly only resonances.

Furthermore, it is easily possible to generate ion beams of other materials by varying the wavelength of the laser beam and the intensity of the electric field or the condition of the gas discharge. For that purpose, many kinds of materials to be ionized may be previously introduced into the container of the ion beam generator. This further provides the capability of conducting two or more ion beam processings successively.

Figure 2:
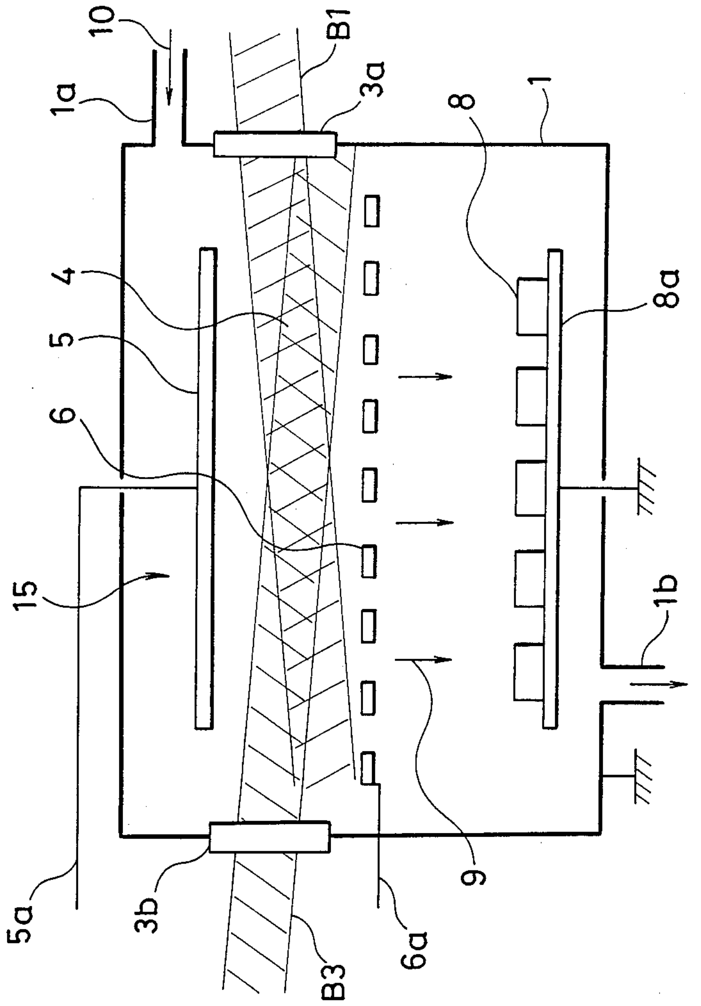
FIG. 2 is a diagram showing a cross-section of a shower type ion beam generator as a first embodiment of the present invention.

FIG. 2 shows a shower type ion beam generator as a first embodiment of the present invention which conducts an ionization of magnesium by a stepwise resonance excitation using laser beams B1 and B3 shown in FIG. 1.

The reference numeral 1 designates a container into which the material to be ionized is introduced. The numeral 1*a* designates a gas inlet for introducing the material vapor which is, for example, generated by heating and evaporating solid or liquid material into the container 1. The numeral 1*b* designates a gas outlet. The numerals 3*a* and 3*b* designate windows for introducing laser beams B1, B3 from the laser beam generator (not shown in FIG. 2) into the container 1. There is provided an ion generating space 4 where the laser beams B1 and B3 intersect with each other. Lasers such as a variable wavelength laser or a free electron laser are used for the laser beam generator.

The numerals 5 and 6 designate electrodes arranged so as to locate the ion generating space 4 therebetween. The numerals 5*a* and 6*a* designate terminals for applying voltages to the electrodes 5 and 6, respectively. These electrodes 5, 6 and terminals 5*a*, 6*a* constitute an electric field generator or gas discharge means 15 for applying an electric field or RF gas discharge for ionizing the material to the ion generating space 4. The numeral 8 designates an object material such as a semiconductor substrate to which the generated ion beam should be irradiated. The numeral 8*a* designates a material support for supporting the object material 8. A dc voltage is applied between the material support 8*a* and the electrode 6 so as to produce an electric field for taking out the ionized material as an ion beam. Besides, the ionizing electric field may also function as an ion taking out electric field.

The device is operated as follows:

At first, magnesium vapor 10 is introduced into the container 1 from the gas inlet 1*a*. A laser beam B1 of 2853 Å generated by the laser beam generator is introduced into the container 1 through the window 3*a*, and a laser beam B3 of 3859 Å also generated by the laser beam generator is introduced into the container 1 through the window 3*b*. Both laser beams B1 and B3 intersect with each other at the ion generating space 4 in the container 1, whereby the magnesium vapor 10 is resonance excited by the laser beam B1 of 2853 Å to the first excited state 3p($^1$P$^0$) from the ground state 3s($^1$S), and it is excited by the laser beam B3 of 3859 Å to the Rydberg state 13d($^1$D) from the first excited state 3p($^1$P$^0$) stepwisely.

Synchronously with the laser oscillation with a delay of about 1 μsec a voltage is applied between the electrodes 5 and 6 through the terminals 5*a* and 6*a*, whereby an electric field or RF gas discharge is applied to the magnesium vapor 10 at the Rydberg state 13d($^1$D) to ionize the same by Stark effect or by the gas discharge itself. A DC voltage is applied between the electrode 6 and the material support 8*a*, whereby the ionized magnesium vapor 10 is taken out to be irradiated to the object material 8 as an ion beam 9 consisting of only magnesium ions.

The features of this first embodiment are as follows:

Firstly, in this first embodiment which conducts a selective ionization by utilizing perfectly only resonances, it is possible to obtain a pure magnesium ion beam consisting of only magnesium ions by making the wavelength of the laser beam not to coincide with the energy level of impurities even if impurities other than magenesium to be ionized such as oxygen, nitrogen, carbon, or hydrogen are contained in the container 1.

Secondly, in this first embodiment which conducts a selective ionization by a resonance excitation, electrons or other elements may not be excited, or may not be heated by an energy absorption. As a result, the object material 8 such as a semiconductor substrate to which the ion beam is to be irradiated may not be heated, thereby enabling low temperature processing.

Thirdly, in order to change the kind and the characteristics of the ion beam is enough to change the wavelength of the laser beam and the intensity of the electric field or the condition of gas discharge, and it is not required to open or close the container for the purpose of taking out the object material or interchanging the ion generating source as required in the conventional device. Accordingly, it is possible to easily conduct a continuous processing of ion injection and annealing, or the like.

Figure 3:
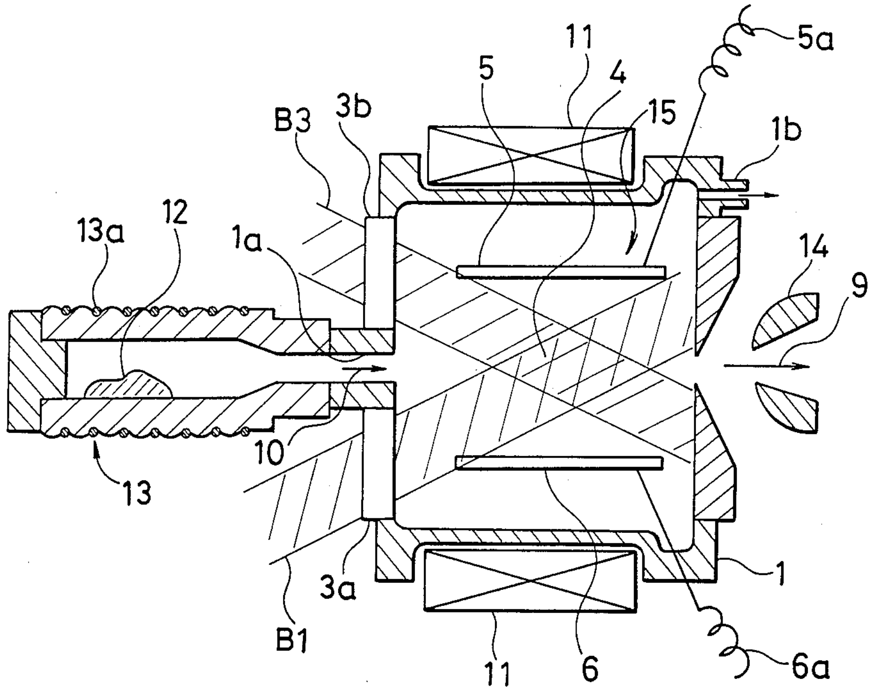
FIG. 3 is a diagram showing a cross-section of a bunching type ion beam generator as a modified version of the first embodiment.

FIG. 3 shows a bunching type ion beam generator as a modified version of the first embodiment.

The same reference numerals designate the same or corresponding elements as those shown in FIG. 2. The reference numeral 13 designates an oven containing the material (magnesium) 12 to be ionized. The numeral 13*a* designates a heater provided surrounding the oven 13. The numeral 11 designates a magnet for bunching the ionized magnesium vapor 10 into the axial center of the container 1. The numeral 14 designates an electrode for taking out the magnesium vapor 10 as an ion beam 9.

This device is operated as follows:

Magnesium to be ionized 12 is inserted into the oven 13, and the oven 13 is heated by the heater 13*a*. Then, magnesium 12 is melted and vaporized to generate a magnesium vapor 10, and the vapor 10 is introduced into the container 1 through the gas inlet 1*a*. The laser beam B1 of 2853 Å and the laser beam B3 of 3859 Å are introduced into the container 1 through the windows 3*a*, 3*b*, respectively, to be irradiated to the vapor 10, and at the same time a voltage is applied between the electrodes 5 and 6 so as to apply an electric field or RF gas discharge to the vapor 10 with a delay of about 1 μsec. Then, the vapor 10 is stepwisely excited to the Rydberg state 13d($^1$D) from the ground state 3s($^1$S) through the first excited state 3p($^1$P$^0$). Furthermore, an electron of the atom of the vapor 10 at the Rydberg state 13d($^1$D) is made apart from the atom to become a free electron by Stark effect or the RF gas discharge, thereby resulting in a magnesium ion. This magnesium ion is bunched into the axial center by the magnet 11, and is taken out as an ion beam 9 by the taking out electrode 14.

Figure 4:
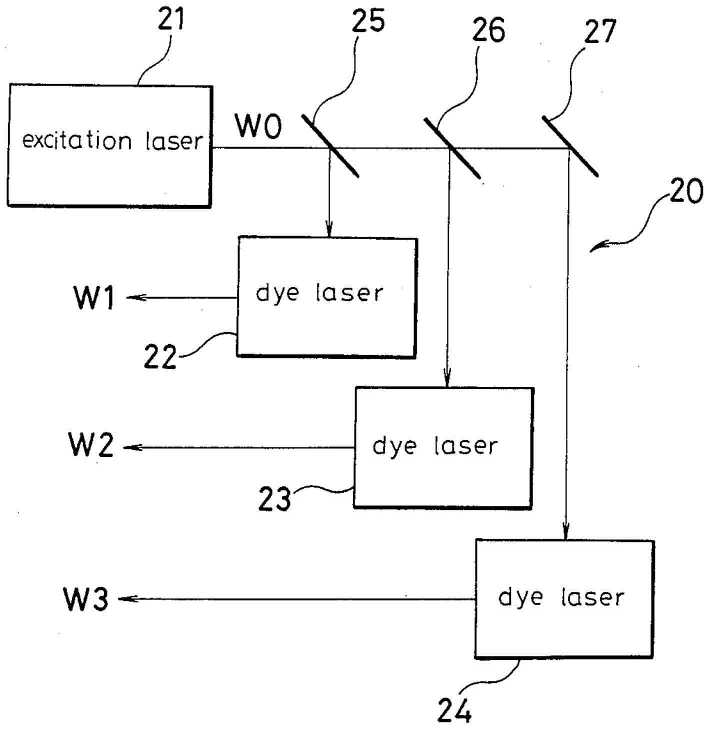
FIG. 4 is a schematic diagram showing a construction of the laser beam generator of the first embodiment using dye lasers excited by an excitation laser.

FIG. 4 shows a construction of the laser beam generator of the first embodiment.

The laser beams and the electric field or the RF gas discharge employed in this first embodiment to generate ions should be synchronously generated together. The construction of FIG. 4 enables this synchronous operation.

The laser beam generator 20 is constituted by three variable wavelength dye lasers 22, 23, 24, an excitation laser 21 for exciting the dye lasers 22, 23, 24, two half mirrors 25, 26, and a total reflection mirror 27. The reference numeral W0 designates a laser output of the excitation laser 21, and the numerals W1, W2, W3 designate laser outputs of the dye lasers 22, 23, 24, respectively. In this construction, the exciter for exciting the three lasers is constituted by one laser 21, whereby the laser beams W1, W2, W3 become synchronized. A gas laser such as an excima or nitrogen gas laser can be used as an excitation laser for exciting dye lasers. Of course, such gas lasers can also be used as an output laser itself. Furthermore, solid lasers such as an alexandrite laser can be used as an excitation laser for exciting dye lasers by its higher harmonic. Solid lasers can also be used as an output laser itself. The application of the electric field synchronized with the generation of the laser beams with a delay of about 1 μsec by conducting the voltage application to the electrodes 5 and 6 synchronously with the oscillation of the excitation laser 21 with a delay of about 1 μsec.

Figure 5:
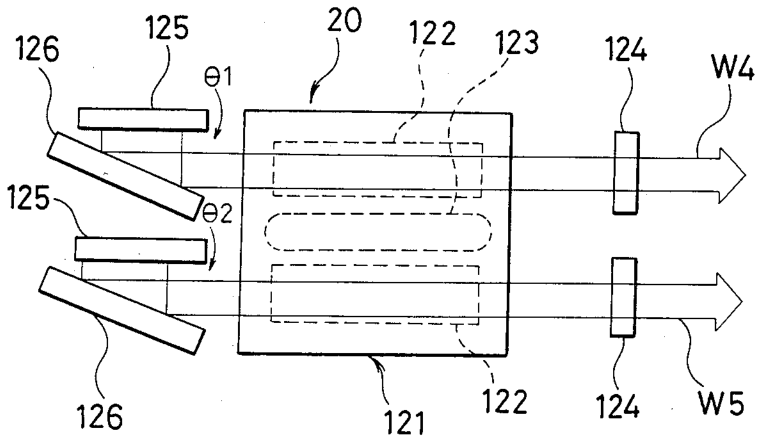
FIGS. 5 and 6 are schematic diagrams showing a first modified version of the laser beam generator of the first embodiment using dye lasers excited by a flash lamp.
Figure 6:
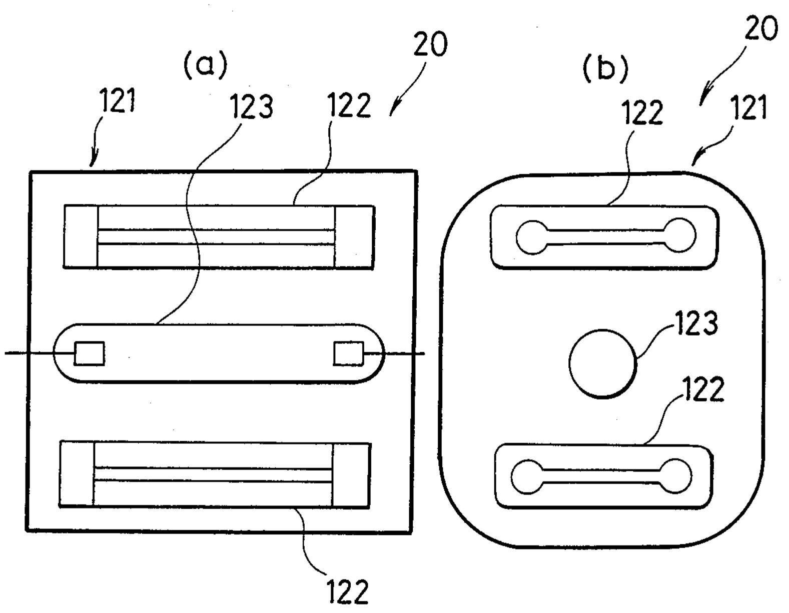

FIGS. 5 and 6 show a first modified version of the laser beam generator 20 of the first embodiment.

This first modified version also enables synchronized operation. The reference numeral 121 designates a reflection mirror cell of the laser beam generator 20. The numeral 122 designates a dye laser cell. The numeral 123 designates a flash lamp. The numeral 124 designates a mirror. The numeral 125 designates a plane mirror. The numeral 126 designates a diffraction lattice. The numerals W4, W5 designate laser beams.

In this first modified version, two dye laser cells 122 are excited by a flash lamp 123, whereby two dye laser beams W4, W5 having different wavelengths are oscillated synchronously with each other.

It is possible to differentiate the wavelengths of the laser beams W4 and W5 by using dye laser cells 122 having different dyes or by varying the angles $\theta 1$ and $\theta 2$ between the plane mirrors 125 and the diffraction lattices 126. By these differentiation of the wavelengths of the laser beams it is possible to select the wavelength with which the material to be ionized is to be resonated. Also it is possible to make the laser beams synchronized with each other. In this way, it is possible to excite the material by a stepwise resonance excitation. It is possible to make the laser beams and the electric field or the gas discharge synchronized with each other by conducting the starting of the flash lamp 123 and the voltage application to the electrodes 5 and 6 at the same time.

Figure 7:
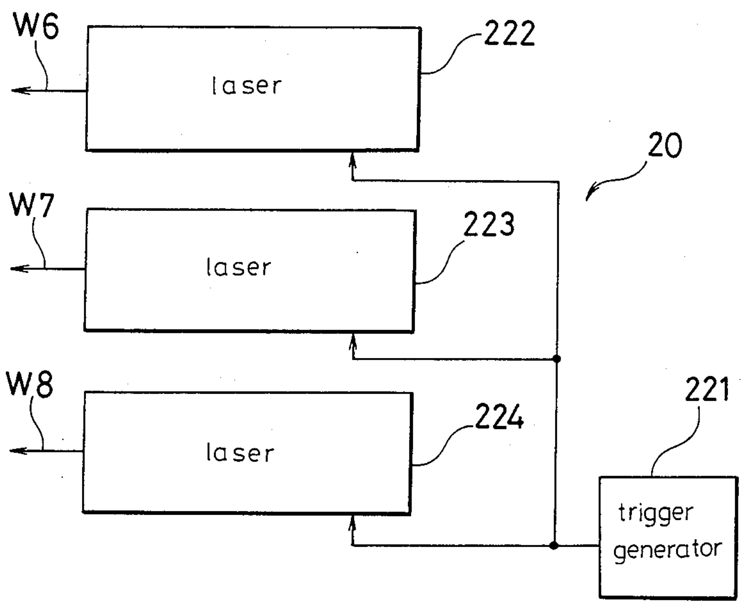
FIGS. 7 and 8 are schematic diagrams showing a second and a third modified version of the laser beam generator of the first embodiment, respectively, both using lasers triggered by an electric signal.

FIG. 7 show a second modified version of the laser beam generator 20 of the first embodiment.

This second modified version also enables synchronized operation. This laser beam generator 20 is constituted by three layers 222, 223, 224 having different wavelengths, and a trigger generator 221 which give an electric pulse signal to the lasers 222 to 224 for triggering their laser oscillation. In this construction, all of the three layers 222 to 224 are triggered to oscillate by a trigger pulse from one trigger generator 221, whereby laser beams W6, W7, W8 are synchronized with each other. The application of the electric field or the gas discharge can be conducted synchronously with the generation of the laser beams by conducting the voltage application to the electrodes 5 and 6 synchronously with the pulse generation of the trigger generator 221.

Figure 8:
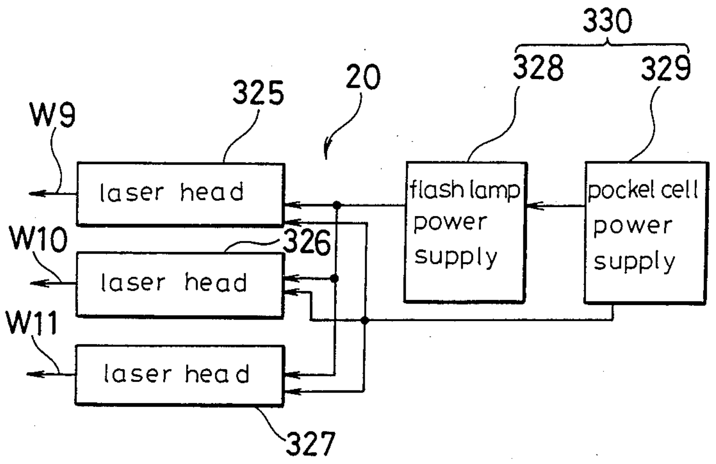

FIG. 8 shows a third modified version of the laser beam generator 20 of the first embodiment.

The reference numerals 325 to 327 designate laser heads of solid lasers. The numeral 328 and 329 designate a flash lamp power supply and a pockel cell power supply for Q switch, respectively. Both of the power supplies 328 and 329 function as a trigger means 330 for triggering the lasers 325 to 327. In this third modified version the, laser heads 325 to 327 commonly uses a set of power supplies 328 and 329, whereby the laser beams W9 to W11 are synchronized with each other.

In this first embodiment the material is ionized by a resonance excitation through the Rydberg state as an intermediate state. But a high excited state close to the Rydberg state can be used as an intermediate state instead of the Rydberg state.

In the first embodiment magnesium is introduced into the container 1 as a monomer vapor, but the material may be introduced into the container 1 as gas of compound or molecular state, and the gas discharge may also function to make the introduced material a neutral atomic state.

A second embodiment of the present invention will be described in detail with reference to FIGS. 9 to 13.

Figure 9:
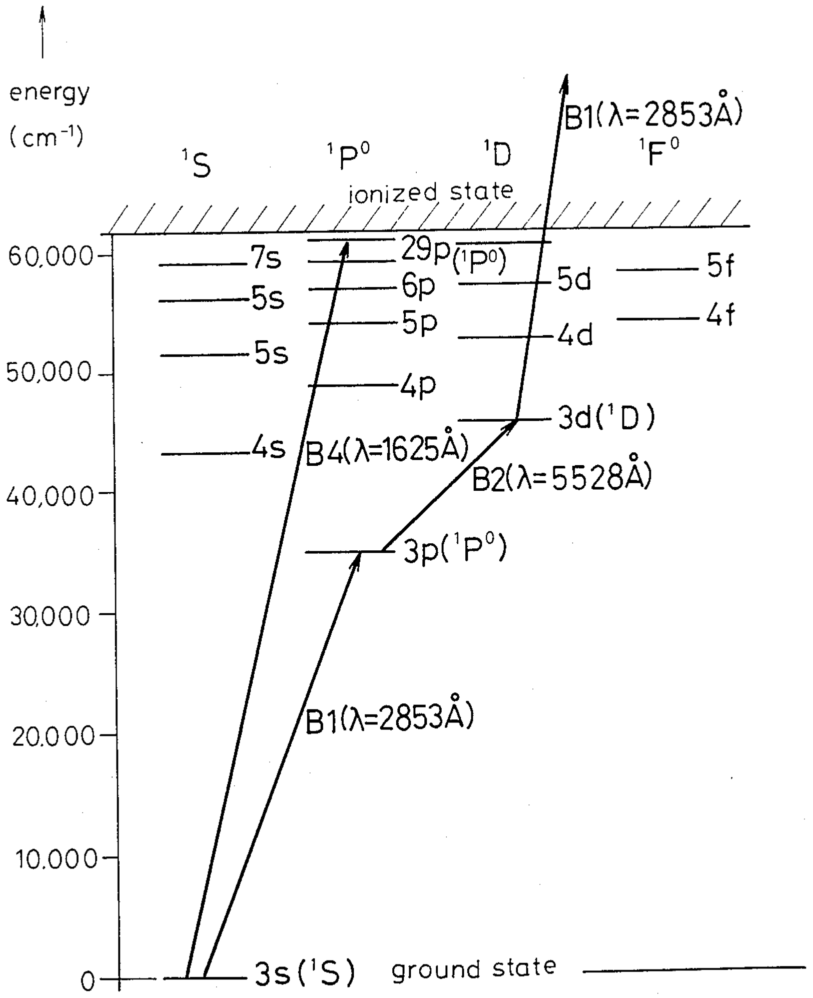
FIG. 9 is a diagram showing the energy levels for a singlet term magnesium neutral atom and the ionization method of the second embodiment of the present invention together with the conventional method.

FIG. 9 shows the ionization method of the second embodiment together with the conventional method.

The conventional ionization method is the same as that shown in FIG. 1. On the other hand, according to the second embodiment, the magnesium vapor is resonance excited by a synchrotron radiation B4 of wavelength 1625 Å directly to the Rydberg state 29p($^1P^0$) from the ground state 3s($^1$S). A synchrotron radiation, especially that having a velocity in a range argued by the theory of relativity has not only the characteristics of having a directionality similarly as the laser beam but also that of tremendously large intensity and high energy, thereby enabling the excitation of the magnesium vapor to a high excited state from the ground state by only one beam. The ionization from the Rydberg state is the same as that of the first embodiment.

The ionization method of this second embodiment has almost the same advantages as those of the first embodiment except for that the laser beam should be replaced by a synchrotron radiation.

Figure 10:
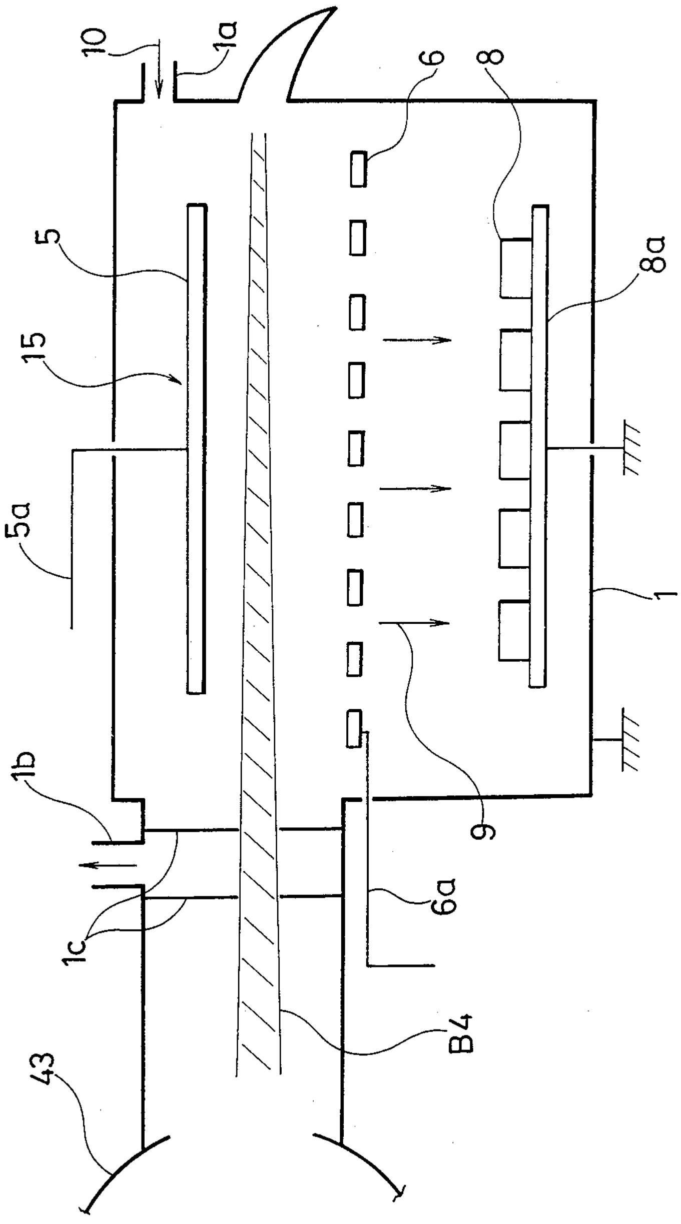
FIG. 10 is a diagram showing a shower type ion beam generator as a second embodiment of the present invention.

FIG. 10 shows a shower type ion beam generator as a second embodiment of the present invention which conducts an ionization of magnesium by a stepwise resonance excitation using the synchrotron radiation B4 shown in FIG. 9.

The reference numerals **1, 1*a*, 1*b*, 5, 5*a*, 6, 6*a*, 8, 8*a*, 9, and 10 designate the same or corresponding elements as those shown in FIG. 2. The reference numeral 43 designates a synchrotron radiation generator for generating a synchrotron radiation B4 of 1625 Å having a narrow wavelength width. The numeral 1*c*** designates a slit.

The device is operated as follows:

At first, magnesium vapor 10 is introduced into the container 1 from the gas inlet *1a*. A synchrotron radiation B4 of wavelength 1625 Å generated by the synchrotron radiation generator 43 is introduced into the container 1, whereby the magnesium vapor 10 is resonance excited by the radiation B4 of 1625 Å to the Rydberg state $29p(^1P^0)$ from the ground state $3s(^1S)$.

Synchronously with the introduction of the synchrotron radiation with a delay of about 1 μsec a voltage is applied between the electrodes 5 and 6 through the terminals *5a* and *6a*, whereby an electric field or RF gas discharge is applied to the magnesium vapor 10 at the Rydberg state $29p(^1P^0)$ to ionize the same by Stark effect or by the RF gas discharge itself. A dc voltage is applied between the electrode 6 and the material support *8a*, whereby the ionized magnesium vapor 10 is taken out to be irradiated to the object material 8 as an ion beam 9 consisting of only magnesium ions.

The features of this second embodiment are as follows:

Firstly, in this second embodiment which conducts a selective ionization by utilizing perfectly only resonances, it is possible to obtain a pure magnesium ion beam consisting of only magnesium ions by making the wavelength of the synchrotron radiation not to coincide with the energy level of impurities even if impurities other than magnesium to be ionized such as oxygen, nitrogen, carbon, or hydrogen are contained in the container 1.

Secondly, in this second embodiment which conducts a selective ionization by a resonance excitation, electrons or other elements may not be excited, or may not be heated by an energy absorption. As a result, the object maerial 8 such as a semiconductor substrate to which the ion beam is to be irradiated may not be heated, thereby enabling low temperature processing.

Thirdly, in order to change the kind and the characteristics of the ion beam it is enough to change the wavelength of the synchrotron radiation and the intensity of the electric field, and it is not required to open or close the container for the purpose of taking out the object material or interchanging the ion generating source as required in the conventional device. Accordingly, it is easily possible to conduct a continuous processing of ion injection and annealing, or the like.

Figure 11:
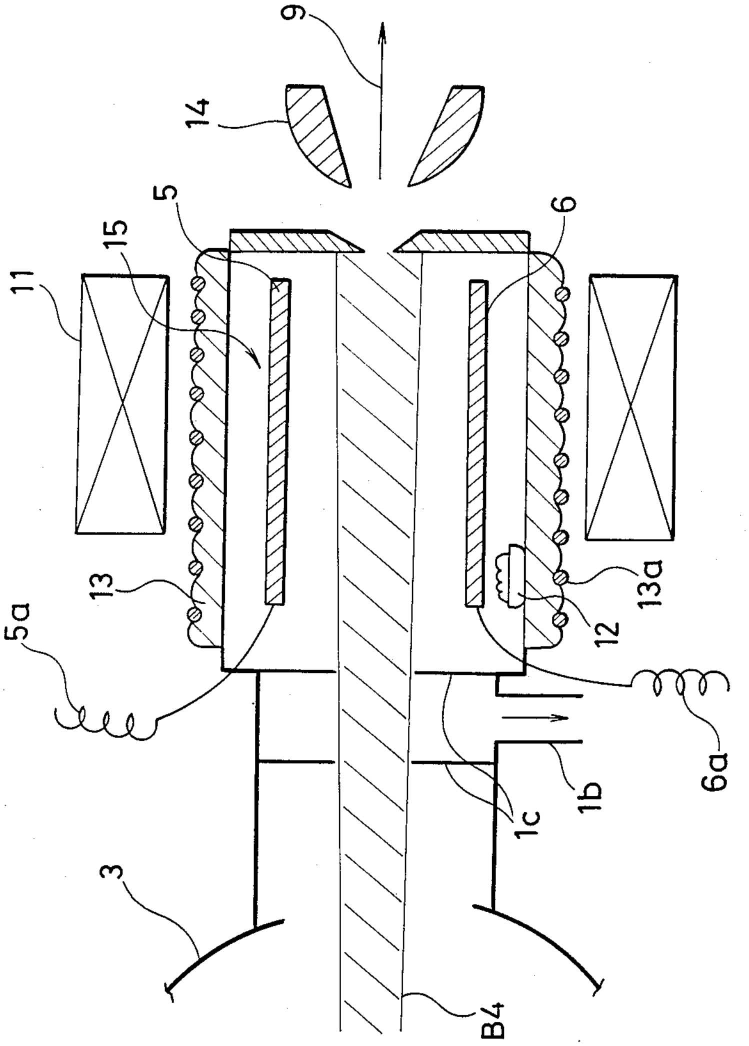
FIG. 11 is a diagram showing a bunching type ion beam generator as a modified version of the second embodiment.

FIG. 11 shows a bunching type ion beam generator as a modified version of the second embodiment.

The same reference numerals designate the same or corresponding elements as those shown in FIG. 10. The reference numeral 13 designates an oven containing the material (magnesium) 12 to be ionized. The numeral *13a* designates a heater provided surrounding the oven 13. The numeral 11 designates a magnet for bunching the ionized magnesium vapor 10 into the axial center of the container 1. The numeral 14 designates an electrode for taking out the magnesium vapor 10 as an ion beam 9.

This device is operated as follows:

Magnesium to be ionized 12 is inserted into the oven 13, and the oven 13 is heated by the heater *13a*. Then, magnesium 12 is melted and vaporized to generate a magnesium vapor 10. The synchrotron radiation B4 of 1625 Å is introduced into the oven 13 to be irradiated to the vapor 10, and at the same time a voltage is applied to between the electrodes 5 and 6 to apply an electric field or a RF gas discharge to the vapor 10 with a delay of about 1 μsec. Then, the vapor 10 is excited to the Rydberg state $29p(^1P^0)$ from the ground state $3s(^1S)$, and furthermore, an electron of the atom of the vapor 10 at the Rydberg state $29p(^1P^0)$ is made apart from the atom to become a free electron by Stark effect or the RF gas discharge, thereby resulting in a magnesium ion. This magnesium ion is bunched into the axial center by the magnet 11, and is taken out as an ion beam 9 by the taking out electrode 14.

Figure 12:
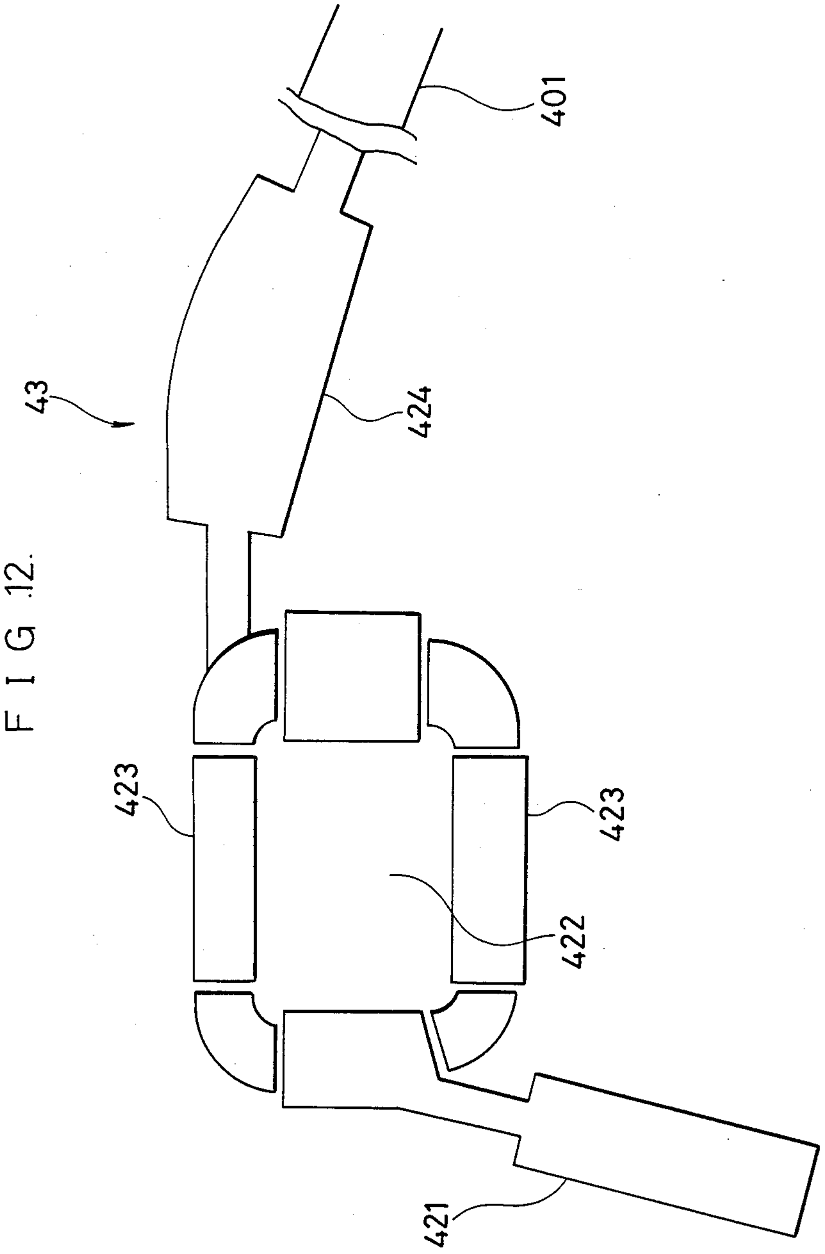
FIG. 12 is a diagram showing a construction of the synchrotron radiation light generator of the second embodiment.

FIG. 12 shows a construction of synchrotron radiation generator 43 of the second embodiment.

The reference numeral 421, 422, 423, 424, and 401 designate a linear accelerator, an electron storage ring, a wiggler or undulator, a spectroscopic system, and a container, respectively.

The synchrotron radiation to be introduced into the container 401 is produced as follows:

Electrons are accelerated by the linear accelerator 421, and injected into the electron storage ring 422. A synchrotron radiation is released from the electrons which are made to have a speed in a range argued by the theory of relativity by the ring 422, and a mono-wavelength channeling radiation is obtained from the synchrotron radiation output from the ring 422 passing through the spectroscopic system 424.

In this synchrotron radiation generator under such a construction it is possible to obtain a feature of a widened range of wavelength variation by the function of the wiggler or undulator 423 which feature is different from the wavelength variability given by the spectroscopic system 424.

Figure 13:
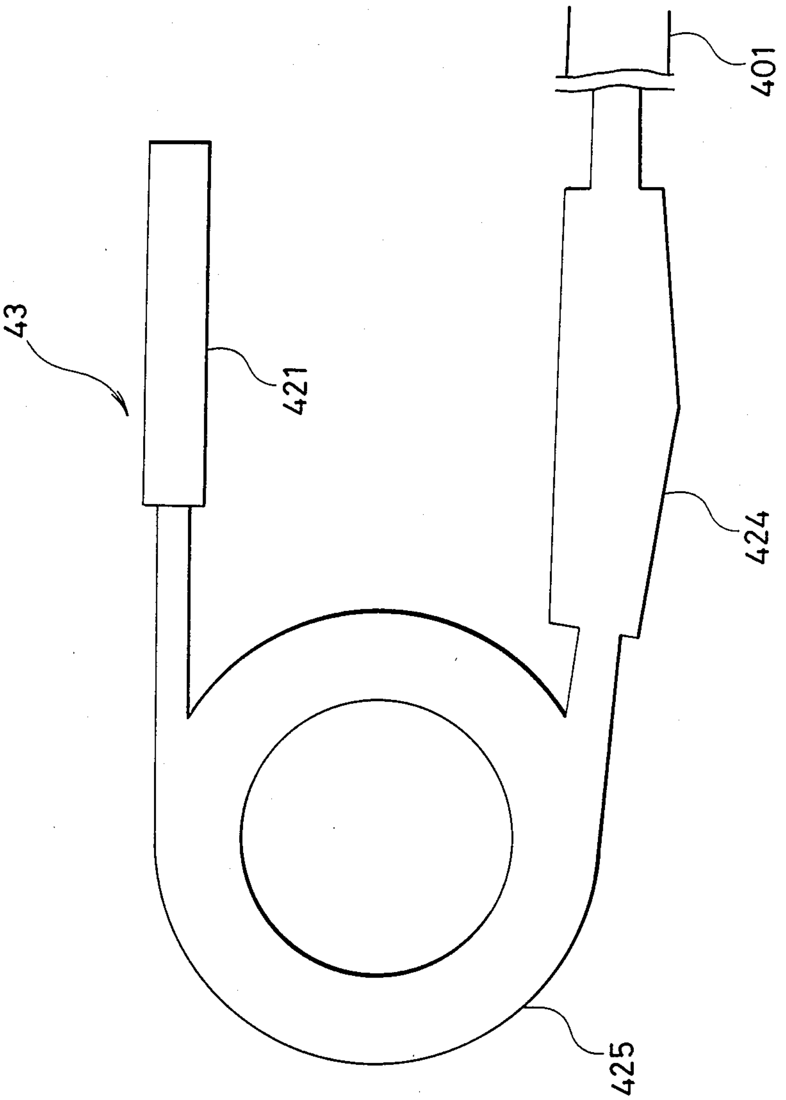
FIG. 13 is a diagram showing a modified version of the synchrotron radiation light generator of the second embodiment.

FIG. 13 shows a modified version of the synchrotron radiation generator of the second embodiment.

The reference numerals 421, 425, 424, and 401 designate a linear accelerator, an electron synchrotron having a circular configuration different from the electron storage ring 422 of FIG. 12, a spectroscopic system, and a container, respectively.

The synchrotron radiation to be introduced into the container 401 is produced as follows:

Electrons are accelerated by the linear accelerator 421, and injected into the electron synchrotron 425. A synchrotron radiation is released from the electrons which are made to have a speed in a range argued by the theory of relativity by the electron synchrotron 425, and a mono-wavelength synchrotron radiation is obtained from the synchrotron radiation output from the electron synchrotron 425 passing through the spectroscopic system 424.

A third embodiment of the present invention will now be described in detail.

Figure 14:
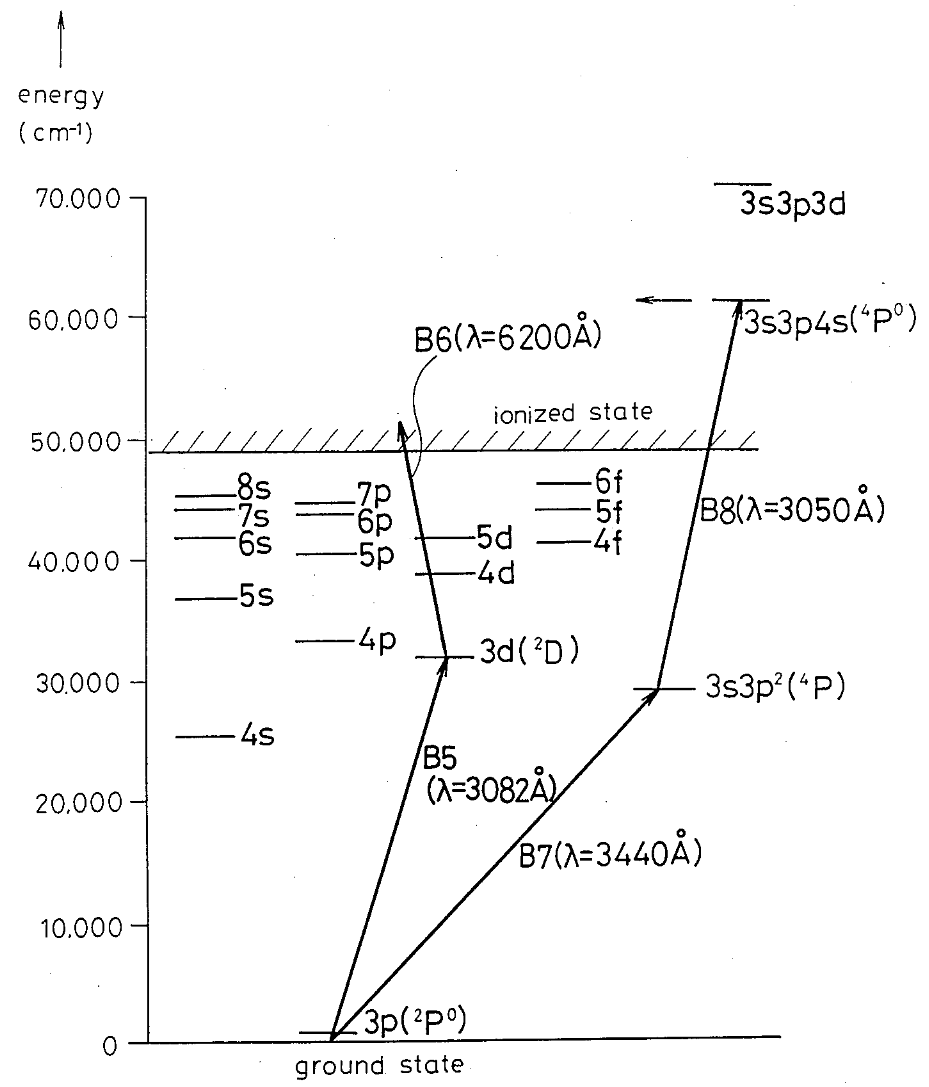
FIGS. 14 and 15 are diagrams showing the energy levels for a singlet term aluminium neutral atom and the ionization method of the third and fourth embodiment of the present invention, respectively, together with the conventional method.

FIG. 14 shows the energy levels for a singlet term aluminium neutral atom and the ionizing method of the third embodiment of the present invention together with the conventional method.

According to the conventional method, two laser beams B5, B6 of wavelength 3082 Å and 6200 Å are irradiated to the aluminium vapor to be ionized. Then, the aluminium atom at the ground state $3p(^2P^0)$ is at first resonance excited to the first excited state $3d(^2D)$ by the laser beam B5 of 3082 Å, and thereafter it is photoionized by the laser beam B6 of 6200 Å.

On the other hand, according to the third embodiment of the present invention, the material to be ionized is directly resonance excited by a laser beam, or stepwisely resonance excited by a plurality of laser beams to the autoionization state from the ground state. For example, the aluminium vapor is resonance excited by the laser beam B7 of wavelength 3440 Å to the two-electron excited state $3s3p^2(^4P)$ from the ground state, and at the same time it is resonance excited by the laser beam B8 of wavelength 3050 Å to the autoionization state $3s3p4s(^4P^0)$ from the two-electron excited state $3s3p^2(^4P)$. Thereafter it is autoionized to the ionized state with a predetermined transition probability from the autoionization state $3s3p4s(^4P^0)$.

The ionization method of this third embodiment has an advantage that the collision cross-sectional area at the ionization is higher by several figures or more than the direct ionization from the energy level $3d(^2D)$ of the conventional method, thereby enabling lower energy output of the laser beam. Furthermore, it is possible to selectively ionize only the material to be ionized by selecting the wavelength of the laser beam not to coincide with the energy level of impurity atoms because the present invention utilizes perfectly only resonances.

Furthermore, it is possible to easily generate ion beams of other materials by varying the wavelength of the laser beam. For that purpose, many kinds of materials to be ionized may be previously introduced into the container of the ion beam generator. This further provides the capability of conducting two or more ion beam processings successively.

The device of this third embodiment is constructed to include a laser beam generator which conducts a stepwise resonance excitation of aluminium vapor to the autoionization state $3s3p4s(^4P^0)$ from the ground state $3p^2(P^0)$ through an intermediate excited state $3s3p^2(^4P)$ by a laser beam B7 of 3440 Å and a laser beam B8 of 3050 Å.

The devices of FIGS. 2 and 3 can be used as devices of this third embodiment by only replacing the laser beam B1 and B3 by B7 and B8, respectively. However, the electrodes 5 and 6 are unnecessary as far as they are used only for an electric field generator or a gas discharge means. That is, the electrode 5 can be removed in the device of FIG. 2, and both of the electrodes 5 and 6 can be removed in the device of FIG. 3.

The laser beam generator of FIG. 4 and the first to third modified versions thereof of FIGS. 5 to 8 can be used as the laser beam generator of this third embodiment.

A fourth embodiment of the present invention will now be described in detail.

Figure 15:
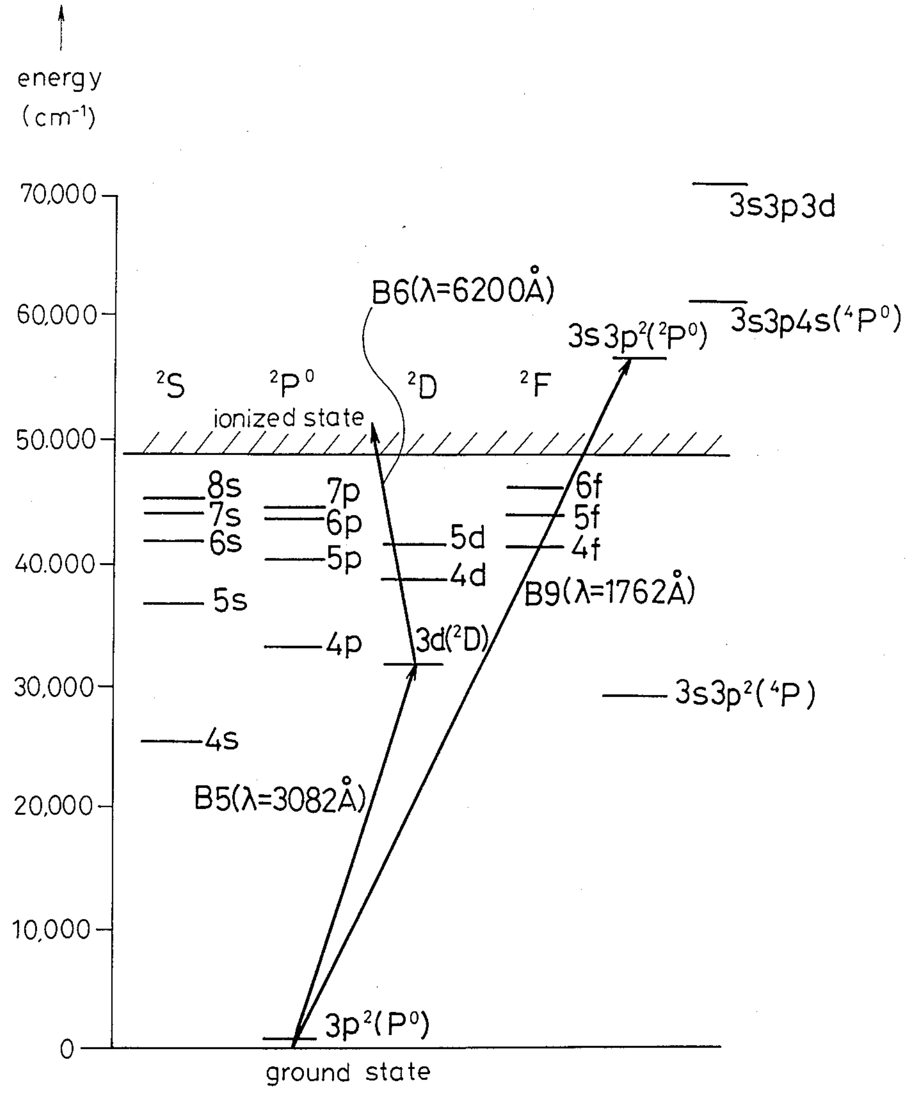

FIG. 15 shows the energy levels for a singlet term aluminium neutral atom and the ionization method of the fourth embodiment together with the conventional method which is the same as that shown in FIG. 14.

According to the fourth embodiment, the aluminium vapor is resonance excited by a synchrotron radiation B9 of wavelength 1762 Å directly to the autoionization state $3s3p^2(^2P^0)$ from the ground state $3p^2(P^0)$. The synchrotron radiation having the above-described characteristics or directionality and that of tremendously large intensity and high energy enables the excitation of the aluminium vapor to a high excited state from the ground state by only one beam. The ionization from the autoionization state is the same as that of the third embodiment.

The ionization method of this fourth embodiment has the same advantages as those of the third embodiment except that the laser beam should be replaced by a synchrotron radiation.

The device of this fourth embodiment is constructed to include a synchrotron radiation generator which conducts a resonance excitation of aluminium vapor to the autoionization state $3s3p^2(P^0)$ from the ground state $3p^2(P^0)$ by a synchrotron radiation B9 of 1762 Å.

The devices of FIGS. 10 and 11 can be used as device of this fourth embodiment by only replacing the light B4 by B9. However, the electrode 5 can be removed in the device of FIG. 10, and both of the electrodes 5 and 6 can be removed in the device of FIG. 11.

The synchrotron radiation generators of FIGS. 12 and 13 can be used as the synchrotron radiation light generator of this fourth embodiment.

As evident from the foregoing description, according to the present invention, the material to be ionized is resonance excited to an intermediate state such as the Rydberg state or the autoionization state from the ground state by a light having a predetermined wavelength, and is ionized from that state by some means. Accordingly, only the desired material is ionized, thereby enhancing the ionization efficiency and the selectivity of ions to a great extent.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An ion beam generator, which comprises:
- an ion generating section for generating ions where a material to be ionized is introduced;
- a light source for introducing a light into said ion generating section which light has a wavelength such that it excites the material to be ionized to a Rydberg state from a ground state of said material by a resonance excitation;
- a pair of electrodes for generating an electric field for ionizing said material by Stark effect which has been excited to the Rydberg state; and
- a material support for supporting a material to which ionized ions are irradiated, which support also functions as an electrode for generating an ion drawing out electric field in cooperation with one of said pair of electrodes such that ions pass through said one of said pair of electrodes to irradiate said material.

2. An ion beam generator as defined in claim 1, wherein said light source comprises at least one dye laser excited by an excitation laser.

3. An ion beam generator as defined in claim 1, wherein said light source comprises at least one dye laser excited by a flash lamp.

4. An ion beam generator as defined in claim 1, wherein said light source comprises a plurality of lasers which oscillate synchronously and are triggered by an electric pulse.

5. An ion beam generator as defined in claim 1, wherein said light source comprises one which generates a plurality of mono-wavelength lights, each light being obtained from a synchrotron radiation passing through a spectroscopic system.

6. An ion beam generator as defined in claim 1, wherein said light source comprises one which generates a plurality of mono-wavelength lights, each light being obtained from a channeling radiation passing through a spectroscopic system.

7. An ion beam generator as defined in claim 1, wherein the light source comprises one or more laser(s) excited by an excitation laser.

8. An ion beam generator as defined in claim 4, wherein the light source comprises one or more laser(s) excited by an excitation laser.

9. An ion beam generator as defined in claim 1, wherein the light source comprises one or more dye laser(s) excited by a flash lamp.

10. An ion beam generator as defined in claim 8, wherein the light source comprises one or more dye laser(s) excited by a flash lamp.

11. An ion beam generator as defined in claim 7, wherein the light source comprises one or more laser(s) which oscillate synchronously with together, triggered by an electric pulse signal.

12. An ion beam generator as defined in claim 8, wherein the light source comprises one or more laser(s) which oscillate synchronously with together, triggered by an electric pulse signal.

13. An ion beam generator as defined in claim 7, wherein the light source comprises one which generates one or more mono-wavelength light(s) each obtained from a synchrotron radiation passing through a spectroscopic system.

14. An ion beam generator as defined in claim 8, wherein the light source comprises one which generates one or more mono-wavelength light(s) each obtained from a synchrotron radiation passing through a spectroscopic system.

15. An ion beam generator as defined in claim 7, wherein the light source comprises one which generates one or more mono-wavelength light(s) each obtained from a channeling radiation passing through a spectroscopic system.

16. An ion beam generator as defined in claim 8, wherein the light source comprises one which generates one or more mono-wavelength light(s) each obtained from a channeling radiation passing through a spectroscopic system.

17. An ion beam generator as defined in claim 9, wherein the light source comprises one or more dye laser(s) excited by an excitation laser.

18. An ion beam generator as defined in claim 10, wherein the light source comprises one or more dye laser(s) excited by an excitation laser.

19. An ion beam generator as defined in claim 9, wherein the light source comprises one or more dye laser(s) excited by a flash lamp.

20. An ion beam generator as defined in claim 10, wherein the light source comprises one or more dye laser(s) excited by a flash lamp.

21. An ion beam generator as defined in claim 9, wherein the light source comprises one or more laser(s) which oscillate synchronously with together, triggered by an electric pulse signal.

22. An ion beam generator as defined in claim 10, wherein the light source comprises one or more laser(s) which oscillate synchronously with together, triggered by an electric pulse signal.

23. An ion beam generator as defined in claim 9, wherein the light source comprises one which generates one or more mono-wavelength light(s) each obtained from a synchrotron radiation passing through a spectroscopic system.

24. An ion beam generator as defined in claim 10, wherein the light source comprises one which generates one or more mono-wavelength light(s) each obtained from a synchrotron radiation passing through a spectroscopic system.

25. An ion beam generator as defined in claim 9, wherein the light source comprises one which generates one or more mono-wavelength light(s) each obtained from a channeling radiation passing through a spectroscopic system.

26. An ion beam generator as defined in claim 10, wherein the light source comprises one which generates one or more mono-wavelength light(s) each obtained from a channeling radiation passing through a spectroscopic system.

27. An ion beam generator as defined in claim 5, wherein the light source comprises one or more dye laser(s) excited by an excitation laser.

28. An ion beam generator as defined in claim 6, wherein the light source comprises one or more dye laser(s) excited by an excitation laser.

29. An ion beam generator as defined in claim 5, wherein the light source comprises one or more dye laser(s) excited by a flash lamp.

30. An ion beam generator as defined in claim 6, wherein the light source comprises one or more dye laser(s) excited by a flash lamp.

31. An ion beam generator as defined in claim 5, wherein the light source comprises one or more laser(s) which synchronously oscillate with together, triggered by an electric pulse signal.

32. An ion beam generator as defined in claim 6, wherein the light source comprises one or more laser(s) which synchronously oscillate with together, triggered by an electric pulse signal.

33. An ion beam generator as defined in claim 5, wherein the light source comprises one which generates one or more mono-wavelength light(s) each obtained from a synchrotron radiation passing through a spectroscopic system.

34. An ion beam generator as defined in claim 6, wherein the light source comprises one which generates one or more mono-wavelength light(s) each obtained from a synchrotron radiation passing through a spectroscopic system.

35. An ion beam generator as defined in claim 5, wherein the light source comprises one which generates one or more mono-wavelength light(s) each obtained from a channeling radiation passing through a spectroscopic system.

36. An ion beam generator as defined in claim 6, wherein the light source comprises one which generates one or more mono-wavelength light(s) each obtained from a channeling radiation passing through a spectroscopic system.

* * * * *